(12) United States Patent
Hudait et al.

(10) Patent No.: US 8,350,291 B2
(45) Date of Patent: Jan. 8, 2013

(54) MODULATION-DOPED MULTI-GATE DEVICES

(75) Inventors: Mantu K. Hudait, Portland, OR (US); Ravi Pillarisetty, Portland, OR (US); Marko Radosavljevic, Beaverton, OR (US); Gilbert Dewey, Hillsboro, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/248,197

(22) Filed: Sep. 29, 2011

(65) Prior Publication Data

US 2012/0018781 A1    Jan. 26, 2012

Related U.S. Application Data

(62) Division of application No. 12/345,489, filed on Dec. 29, 2008, now Pat. No. 8,120,063.

(51) Int. Cl.
*H01L 29/78* (2006.01)

(52) U.S. Cl. ........ 257/190; 257/192; 257/296; 257/315; 257/241; 257/262; 257/E21.19; 257/E21.21; 257/E21.694; 438/285

(58) Field of Classification Search .................. 257/190, 257/296, 315, 192, E21.19, E21.21, E21.394, 257/E21.431; 438/285
See application file for complete search history.

(56) References Cited

U.S. PATENT DOCUMENTS

| | | | |
|---|---|---|---|
| 2004/0262626 A1 | 12/2004 | Tsai | |
| 2006/0113605 A1 | 6/2006 | Currie | |
| 2006/0197129 A1* | 9/2006 | Wohlmuth | 257/296 |
| 2008/0224183 A1* | 9/2008 | Nawaz | 257/279 |
| 2010/0163926 A1 | 7/2010 | Hudait et al. | |

* cited by examiner

*Primary Examiner* — Marc Armand
(74) *Attorney, Agent, or Firm* — Cool Patent, P.C.; Joseph P. Curtin

(57) ABSTRACT

Modulation-doped multi-gate devices are generally described. In one example, an apparatus includes a semiconductor substrate having a surface, one or more buffer films coupled to the surface of the semiconductor substrate, a first barrier film coupled to the one or more buffer films, a multi-gate fin coupled to the first barrier film, the multi-gate fin comprising a source region, a drain region, and a channel region of a multi-gate device wherein the channel region is disposed between the source region and the drain region, a spacer film coupled to the multi-gate fin, and a doped film coupled to the spacer film.

6 Claims, 5 Drawing Sheets

MODULATION-DOPED MULTI-GATE DEVICES

BACKGROUND CROSS-REFERENCE TO RELATED PATENT APPLICATION

The present patent application is a divisional patent application of U.S. patent application Ser. No. 12/345,489, filed Dec. 28, 2008, entitled "Modulation-Doped Multi-Gate Device," and invented by Mantu K. Hudait et al., the disclosure of which is incorporated by reference herein.

BACKGROUND

Generally, semiconductor heterostructures are emerging as material structures upon which electronic or optoelectronic devices may be formed. Electronic or optoelectronic devices formed on semiconductor heterostructures may have at least increased carrier mobility compared with devices formed on conventional silicon. Non-planar devices such as multi-gate devices may demonstrate at least decreased short channel effects compared with conventional planar devices.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
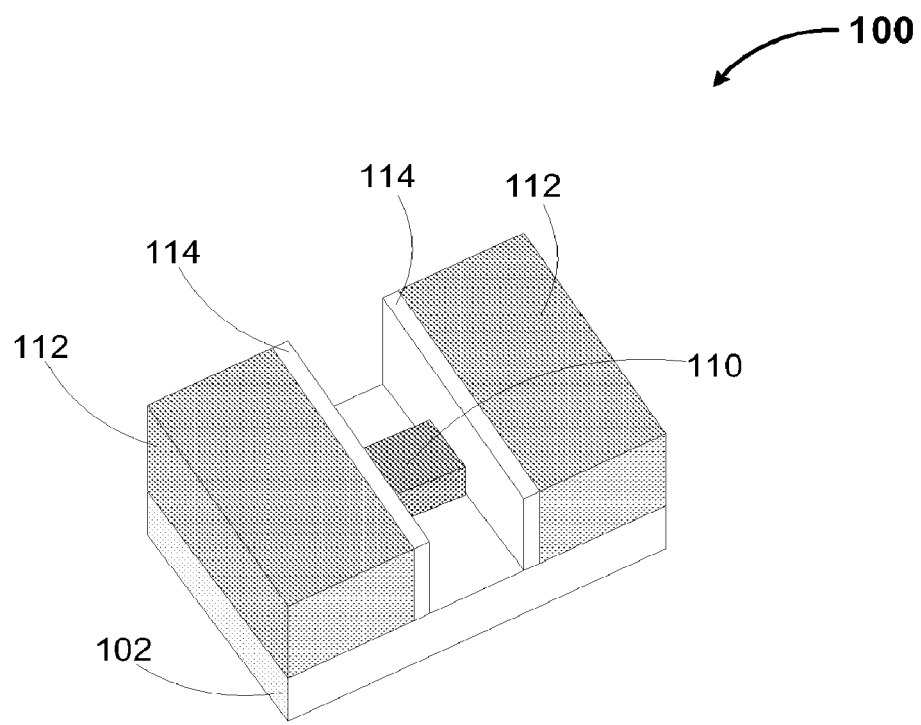
FIG. 1 is a cross-section schematic of a multi-gate device, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of a modulation-doped multi-gate device are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is a cross-section schematic of a multi-gate device, according to but one to embodiment. In an embodiment, a multi-gate device 100 comprises a semiconductor substrate 102, a multi-gate fin 110, a dielectric material 112, and gate spacer structure 114, coupled as shown.

One or more multi-gate fins 110 or pillars may be coupled to the semiconductor substrate 102. In an embodiment, multi-gate fin 110 comprises a source region, a drain region, and a gate region of multi-gate device 100 wherein the gate region is disposed between the source region and the drain region. In an embodiment, the gate region of the multi-gate fin 110 remains visible and exposed in FIG. 1 and is covered by gate material 215 in FIG. 2. In another embodiment according to FIG. 1, the source region and the drain region of the multi-gate fin 110 are covered by the dielectric material 112. The gate region of the multi-gate fin 110 may comprise a channel region of multi-gate device 100. In an embodiment, multi-gate fin 110 comprises a group III-V semiconductor, or a group II-VI semiconductor, or combinations thereof. Subject matter is not limited in this regard and other materials for multi-gate fin 110 may be used in other embodiments.

Semiconductor substrate 102 may comprise silicon (Si) in an embodiment. In another embodiment, semiconductor substrate 102 comprises a semiconductor heterostructure 200 formed thereon as described with respect to FIG. 2. In other embodiments, semiconductor substrate 102 includes any suitable semiconductor material for fabricating a multi-gate device 100. Dielectric material 112 may comprise silicon oxide (SiO$_2$) in an embodiment. In other embodiments, dielectric material 112 includes any suitable dielectric material for fabricating a multi-gate device 100. Gate spacer structure 114 may comprise silicon nitride (SiN) in an embodiment. In other embodiments, gate spacer structure 114 includes any suitable spacer material for fabricating a multi-gate device 100 in accordance with embodiments described to herein.

Figure 2:
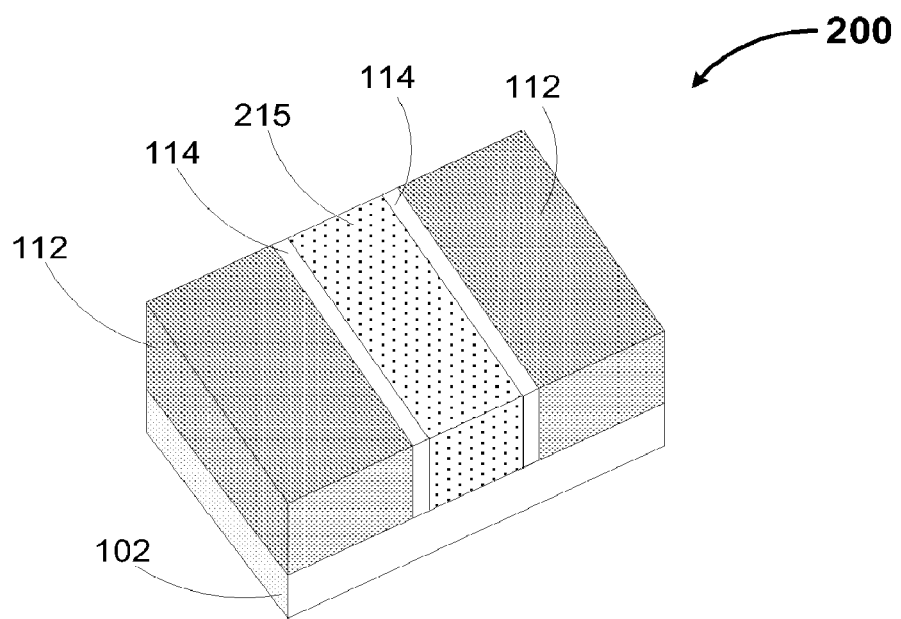
FIG. 2 is another cross-section schematic of a multi-gate device, according to but one embodiment.

FIG. 2 is another cross-section schematic of a multi-gate device, according to but one embodiment. In an embodiment, multi-gate device 200 comprises semiconductor substrate 102, dielectric material 112, gate spacer structure 114, and gate material 215, coupled as shown. One or more multi-gate fins 110 or pillars may be coupled to the semiconductor substrate 102 according to FIG. 1 and multi-gate fin 110 may be covered by dielectric material 112, gate spacer structure 114, and gate material 215 in FIG. 2.

Gate material 215 may comprise one or more materials. In an embodiment, gate material 215 includes one or more dielectric materials having a higher bandgap than multi-gate fin 110 coupled with the multi-gate fin 110 and one or more gate electrode materials having a lower bandgap than the one or more dielectric materials coupled to the dielectric materials. Gate material 215 and other materials coupled with multi-gate fin 110 may be described further with respect to FIG. 5.

Figure 3:
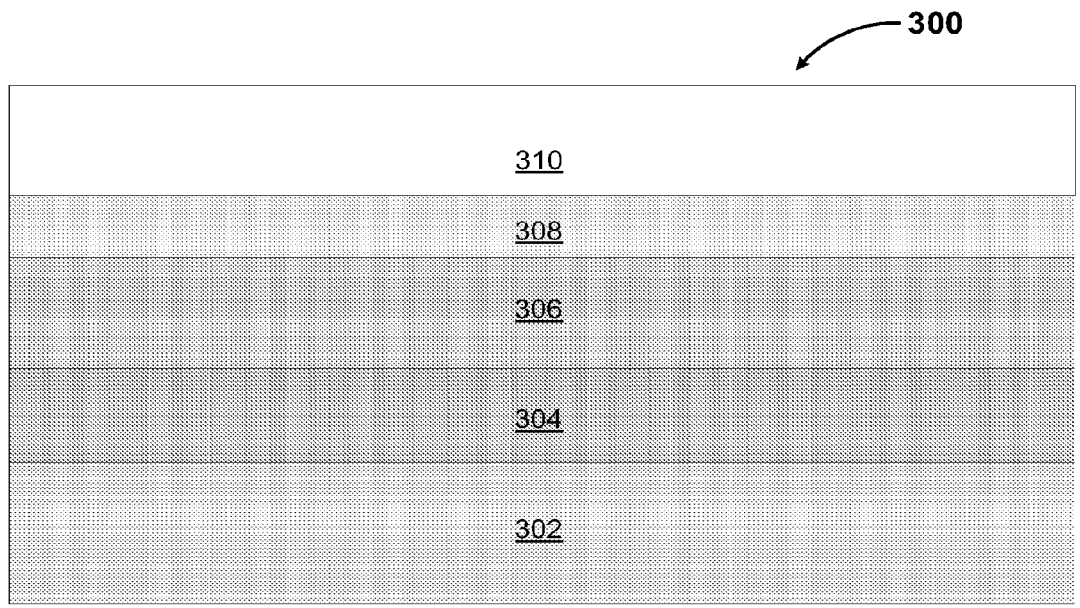
FIG. 3 is an elevation cross-section schematic of a semiconductor heterostructure, according to but one embodiment.

FIG. 3 is an elevation cross-section schematic of a semiconductor heterostructure, according to but one embodiment. In an embodiment, semiconductor heterostructure 300 includes a semiconductor substrate 302, a buffer film 304, a graded buffer film 306, a first barrier film 308, and a multi-gate fin material 310 to form a multi-gate fin 410, coupled as shown. In another embodiment, semiconductor heterostructure 300 comprises a semiconductor substrate 302 having a surface, one or more buffer films 304, 306 coupled to the surface of the semiconductor substrate 302, a first barrier film 308 coupled to the one or more buffer films 304, 306, and a multi-gate fin material 310 coupled to the first barrier film 308.

In an embodiment, semiconductor heterostructure 300 comprises group III-V to semiconductor materials. In other embodiments, semiconductor heterostructure 300 includes group II-VI semiconductor materials or other suitable materials. Transistors formed in semiconductor heterostructure 300 may have higher carrier mobility than, for example, conventional silicon transistors.

Semiconductor heterostructure 300 may be used to form n-type metal-oxide-semiconductor (NMOS) or p-type metal-oxide-semiconductor (PMOS) devices including, for example, logic, analog, or memory devices, or combinations thereof. In an embodiment, a multi-gate device such as, for example, a tri-gate device or fin field-effect-transistor (fin-FET) is formed using semiconductor heterostructure 300. In an embodiment, a semiconductor heterostructure 300 includes a semiconductor substrate 302. Semiconductor substrate 302 may include n-type or p-type (100) off-oriented silicon, the crystalline directions of the substrate 302 being symbolized by the convention (xyz), where x, y, and z are crystallographic planes in three dimensions that are perpendicular to one another. In an embodiment, semiconductor substrate 302 includes material of a (100) direction off-cut in a range between about 2 degrees to about 8 degrees towards a (110) direction. In other embodiments, other off-cut orientations or a substrate 302 without an off-cut orientation may be used. In another embodiment, semiconductor substrate 302 has a high resistivity between about 1 Ω-cm to about 50 kΩ-cm. A high resistivity substrate 302 may provide for device isolation and off-cutting may eliminate anti-phase domains in anti-phase boundaries. Semiconductor substrate 302 may include other material systems in other embodiment, including, for example, germanium (Ge) or other semiconductor materials, or combinations thereof.

One or more buffer films 304, 306 may be coupled to the semiconductor substrate 302. In an embodiment, one or more buffer films 304, 306 comprise a nucleation buffer film 304 and a graded buffer film 306. A nucleation buffer film 304 comprises gallium arsenide (GaAs) in one embodiment. Other material systems may be used to form nucleation buffer film 304 including NMOS or PMOS material systems. In an embodiment, a nucleation buffer film 304 is used to fill semiconductor substrate 302 terraces with atomic bi-films of a semiconductor material including, for example, one or more group III-V semiconductor materials, one or more Is group II-VI semiconductor materials, or combinations thereof. A nucleation portion of nucleation buffer film 304 may create a virtual polar substrate 302. Such nucleation portion may have a thickness less than about 50 nanometers (nm) in one or more embodiments. A buffer film portion of nucleation buffer film 304 may serve as a buffer against dislocation threading and/or provide control of a lattice mismatch of about 4% to about 8% between a semiconductor substrate 302 and a first barrier film 308. The buffer film portion of nucleation buffer film 304 may have a thickness less than about 5 microns, in one or more embodiments.

A graded buffer film 306 may be coupled to nucleation buffer film 304. Graded buffer film 306 may comprise group III-V semiconductor material, group II-VI semiconductor material, or combinations thereof, including, for example, indium aluminum arsenide ($In_xAl_{1-x}As$), where x has a value between 0 and 1, representing the relative composition of the elements. In one embodiment, x comprises values between about 0 and about 0.52. In another embodiment, graded buffer film 306 comprises indium aluminum antimonide (InAlSb). Other material systems including NMOS or PMOS materials may be used for graded buffer film 306 in other embodiments. Graded buffer film 306 may have a thickness less than about 2 microns in various embodiments. In an embodiment, graded buffer film 306 comprises inverse graded InAlAs or indium gallium aluminum arsenide (InGaAlAs) to provide a larger bandgap for device isolation. Increasing the relative percentage of aluminum (Al) in the graded buffer film 306 may increase to strain to multi-gate fin material 310, and thus, to multi-gate fin 410. A graded buffer film 306 may also provide stress relaxation between semiconductor substrate 302 and other lattice mismatched films such as first barrier film 308.

Together, nucleation buffer film 304 and graded buffer film 306 may form a dislocation filtering buffer. One ore more buffer films 304, 306 may provide compressive strain for one or multi-gate fins 410. One or more buffer films 304, 306 may further provide a buffer for lattice control mismatch between semiconductor substrate 302 and other films such as first barrier film 308 to reduce threading dislocation defects in semiconductor heterostructure 300. Other thicknesses for one or more buffer films 304, 306 may be used in other embodiments.

A first barrier film 308 may be coupled to the one or more buffer films 304, 306. First barrier film 308 may comprise group III-V semiconductor material, group II-VI semiconductor material, or combinations thereof, including, for example, indium aluminum arsenide ($In_xAl_{1-x}As$), where x has a value between 0 and 1, representing the relative composition of the elements. In an embodiment, x comprises a value between about 0.5 and about 0.8. In another embodiment, a first barrier film 308 comprises indium aluminum antimonide (InAlSb). Other material systems including NMOS materials and/or PMOS materials may be used for a first barrier film 308 in other embodiments. First barrier film 308 may comprise a material that has a higher bandgap than a material 310 used for multi-gate fin 410. First barrier film 308 may comprise a thickness sufficient to provide a potential barrier to charge carriers in semiconductor heterostructure 300. In an embodiment, first barrier film 308 has a thickness less than about 200 nm. Other thicknesses for first barrier film 308 may be used in other embodiments.

A multi-gate fin material 310 may be coupled with the first barrier film 308. Multi-gate fin material 310 may comprise group III-V semiconductor material, group II-VI semiconductor to material, or combinations thereof, including, for example, indium gallium arsenide ($In_xGa_{1-x}As$), where x has a value between 0 and 1, representing the relative composition of the elements. In an embodiment, x comprises values between about 0.5 and about 0.8. Multi-gate fin material 310 may comprise indium antimonide (InSb) in another embodiment. Multi-gate fin material 310 may include various other material systems in other embodiments including NMOS and PMOS materials.

Multi-gate fin material 310 may have a smaller bandgap than a material of a first barrier film 308. In an embodiment, multi-gate fin material 310 comprises a thickness that provides sufficient channel conductance. In an embodiment, multi-gate fin material 310 comprises a thickness less than about 30 nanometers. Subject matter is not limited in this regard and multi-gate fin material 310 may include other thicknesses in other embodiments.

Semiconductor heterostructure 300 may be formed using a variety of techniques. In an embodiment, semiconductor substrate 302, one or more buffer films 304, 306, first barrier film 308, and multi-gate fin material 310 are epitaxially coupled. Such films may be epitaxially deposited, for example, by molecular beam epitaxy (MBE), atomic layer epitaxy (ALE), epitaxial growth, chemical beam epitaxy (CBE), metal-organic chemical vapor deposition (MOCVD), or combinations thereof. Other epitaxial deposition techniques may be used in other embodiments.

Figure 4:
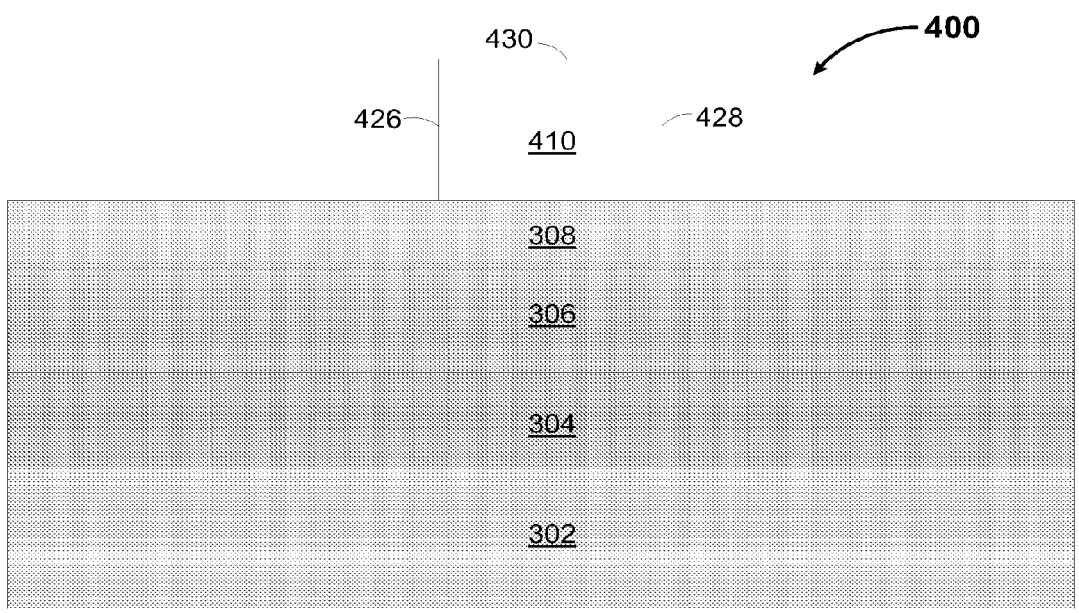
FIG. 4 is an elevation cross-section schematic of a multi-gate fin formed on a semiconductor heterostructure, according to but one embodiment.

FIG. 4 is an elevation cross-section schematic of a multi-gate fin formed on a semiconductor heterostructure, according to but one embodiment. In an embodiment, a multi-gate device 400 includes a semiconductor substrate 302, one or more buffer films 304, 306, first barrier film 308, and multi-gate fin 410, coupled as shown. Semiconductor substrate 302, one or more buffer films 304, 306, first barrier film 308, and multi-gate fin 410 may include embodiments described with respect to FIG. 3. FIG. 4 may depict a cross-section along a direction that is substantially perpendicular to a lengthwise direction of a multi-gate fin 410. The lengthwise direction of multi-gate fin 410 may be, for example, a direction that runs from the source region of a multi-gate fin 100 towards the drain region of the multi-gate fin 100 according to FIG. 1.

Multi-gate fin 410 may be formed by patterning multi-gate fin material 310. Patterning may include, for example, photolithography and/or etch processes to define a multi-gate fin 410. In an embodiment, multi-gate fin 410 includes a first surface 426, a second surface 428, and a third surface 430. The third surface 430 may be substantially parallel with the surface of the semiconductor substrate 302. The first surface 426 may be substantially parallel with the second surface 428 and substantially perpendicular with the third surface 430. Substantially parallel may be broadly construed. For example, the first surface 426 and second surface 428 may be sidewalls with rounded profiles or more sloped sidewalls than depicted. In an embodiment, the term "substantially parallel" includes, for example, a first surface 426 and second surface 428 within about 40 degrees of one another. Multi-gate fin 410 may comprise a tri-gate fin, or a finFET, in one or more embodiments. In one embodiment, the width of multi-gate fin 410 fin between first surface 426 and second surface 428 can be between about 5 nm to about 25 nm, and the height of multi-gate fin 410 between third surface 430 and the top of layer 308 can be between about 5 nm to about 50 nm. It should be understood that other widths and heights are also possible.

Figure 5:
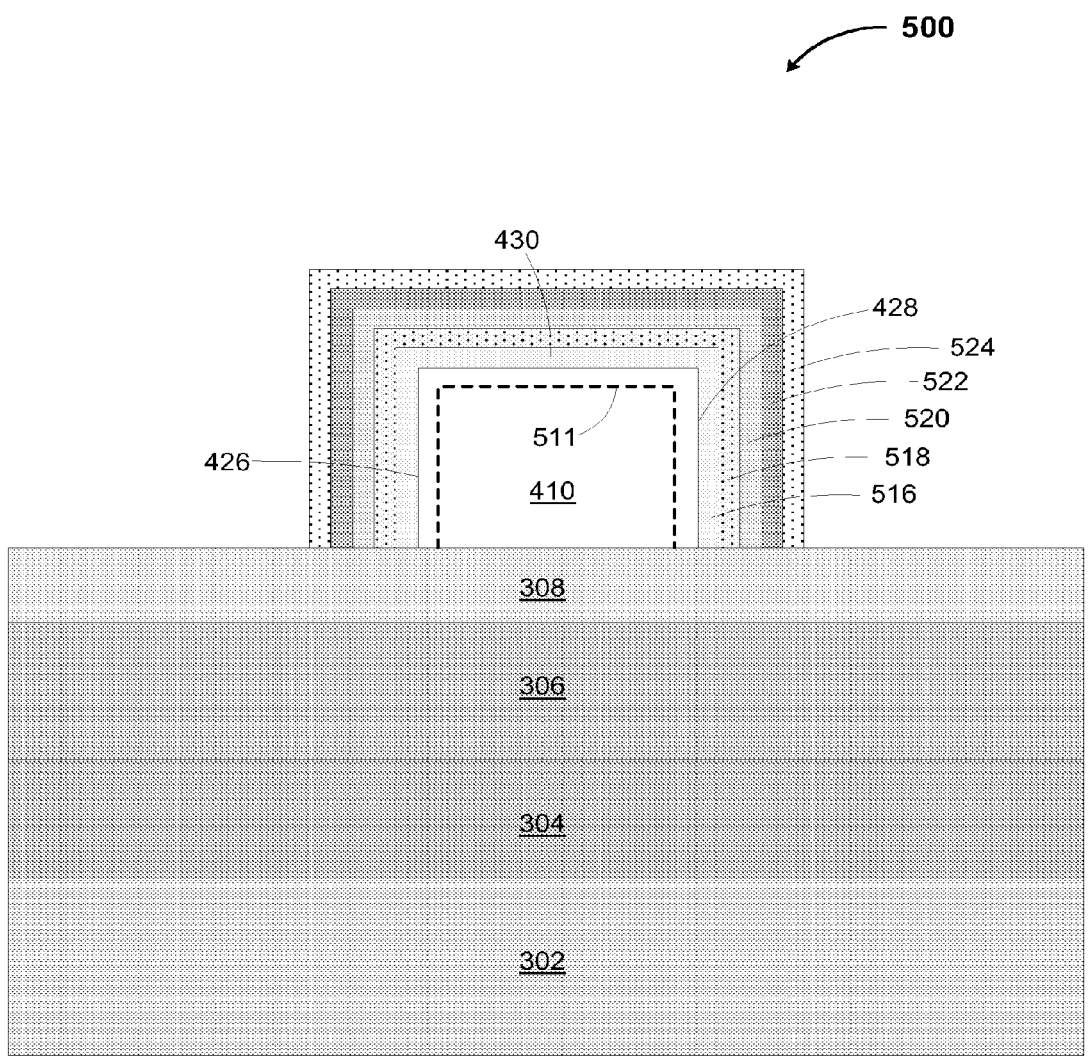
FIG. 5 is an elevation cross-section schematic of a multi-gate device, according to but one embodiment.

In an embodiment, no body doping is introduced to the material of multi-gate fin 410. For example, multi-gate fin 410 does not receive implant of body dopants in one embodiment. In an embodiment, multi-gate fin 410 includes a doped layer 518 as depicted in FIG. 5 instead to of body dopants in the active body of the multi-gate fin 410. In an embodiment, multi-gate fin 400 comprises a channel region wherein the channel region does not comprise dopant. Dopant may refer to intentionally introduced impurity or impurities to alter the electrical properties of a material used in a multi-gate device 400. In an embodiment, the multi-gate fin 410 comprises the carrier wave function of multi-gate device 400.

FIG. 5 is an elevation cross-section schematic of a multi-gate device, according to but one embodiment. In an embodiment, a multi-gate device 500 includes a semiconductor substrate 302, one or more buffer films 304, 306, first barrier film 308, multi-gate fin 410, a representation of a two-dimensional electron gas (2DEG) 511, spacer film 516, doped film 518, second barrier film 520, etch stop film 522, and contact film 524, coupled as shown. Multi-gate device 500 may include embodiments described with respect to FIGS. 3-4. FIG. 5 may depict a cross-section along a direction that is substantially perpendicular to a lengthwise direction of a multi-gate fin 410. The lengthwise direction of multi-gate fin 410 may be, for example, a direction that runs from the source region of a multi-gate fin 100 towards the drain region of the multi-gate fin 100 according to FIG. 1. In another embodiment, multi-gate device 500 depicts a cross-section in the channel or gate region as described with respect to multi-gate device 100.

Multi-gate device 500 may include a spacer film 516 coupled to the multi-gate fin 410. Spacer film 516 may provide carrier confinement and/or reduce interaction between doped film 518 and multi-gate fin 410. Spacer film 516 may comprise group III-V semiconductor material, group II-VI semiconductor material, or combinations thereof, including, for example, indium aluminum arsenide ($In_xAl_{1-x}As$), where x comprises a value between 0 and 1, representing the relative composition of the elements. In an embodiment, x comprises values between about 0.5 and about 0.8. In another embodiment, spacer film 516 comprises indium aluminum antimonide to (InAlSb). Other material systems may be used to form spacer film 516 including NMOS or PMOS materials systems.

Spacer film 516 may comprise a thickness less than about 15 nm and may include other thicknesses in other embodiments. Spacer film 516 may further provide strain to the multi-gate device 410. For example, in an embodiment where spacer film 516 comprises InAlAs or InAlSb, an increase in the relative percentage of aluminum (Al) in the spacer film 516 may increase strain in the multi-gate fin 410. In an embodiment where the multi-gate fin 410 includes a first surface 426, second surface 428, and third surface 430, the spacer film is coupled to substantially cover the first surface 426, the second surface 428, and the third surface 430 of the multi-gate fin 410 in the channel region. Spacer film 516 may be a different structure than gate spacer structure 114 of multi-gate device 100.

A doped film 518 may be coupled to the spacer film 516. Doped film 518 may be delta-doped, modulation doped, and/or combinations thereof. In an embodiment, doped film 518 comprises a semiconductor material. In an embodiment, doped film 518 is doped with silicon (Si), tellurium (Te), or combinations thereof, for an NMOS device. In another embodiment, doped film 518 is doped with beryllium (Be), carbon (C), or combinations thereof, for a PMOS device. In an embodiment, an NMOS device comprises a multi-gate fin 410 comprising InGaAs wherein the dopant of doped film 518 comprises Si. In another embodiment, an NMOS device comprises a multi-gate fin 410 comprising InSb wherein the dopant of doped film 518 comprises Te. Other dopants or impurities may be used in doped film 118 in other embodiments and may be selected according to whether device 500 operation is majority or minority carrier based. In an embodiment, doped film 518 comprises a thickness of about 3 angstroms to about 5 angstroms. In another embodiment, doped film 518 comprises a thickness less than about 10 angstroms. Other thicknesses for doped film 518 may be used in other embodiments.

Other doping of multi-gate device 500 such as source and drain or tip doping may comprise dopants including, for example, silicon (Si), tellurium (Te), or combinations thereof, for an NMOS device or beryllium (Be), carbon (C), or combinations thereof, for a PMOS device. A dopant may further be selected based on whether the device 500 operates as depletion or enhancement mode. In depletion mode, a threshold voltage is negative or normally "on" for an n-type device and positive or normally "off" for a p-type device. In enhancement mode, a threshold voltage is positive or normally "off" for an n-type device and negative or normally "on" for a p-type device.

Doped film 518 may be deposited to substantially cover a spacer film 516 in the channel region of multi-gate device 500 wherein the spacer film 516 substantially covers the first surface 426, the second surface 428, and the third surface 430 of multi-gate fin 410 in the channel region of multi-gate device 500. In an embodiment, the doped film 518 provides higher carrier mobility and/or reduced impurity scattering in the multi-gate device 500 than a multi-gate device comprising dopant in a channel region of a multi-gate fin. Doped film 518 may increase carrier mobility by reducing impurity scattering. A multi-gate device 500 described herein may decrease short channel effects and allow for shorter gate lengths or lower threshold voltages in a modulation delta doped device. In an embodiment, multi-gate device 500 comprises a modulation doped, re-growth non-planar device that provides electrostatics benefits of a multi-gate device and the higher mobility benefits of a modulation doped device.

A second barrier film 520 may be coupled to the doped film 518. Second barrier film 520 may comprise group III-V semiconductor material, group II-VI semiconductor material, or combinations thereof, including, for example, indium aluminum arsenide ($In_xAl_{1-x}As$), where x to has a value between 0 and 1, representing the relative composition of the elements. In an embodiment, x comprises a value between about 0.5 and about 0.8. In another embodiment, second barrier film 520 comprises InAlSb. Other material systems including NMOS materials and/or PMOS materials may be used for a second barrier film 520 in other embodiments. Second barrier film 520 may comprise a material that has a higher bandgap than a material used for multi-gate fin 410. Second barrier film 520 may provide gate control. In an embodiment, second barrier film 520 has a thickness less than about 15 nm. Other thicknesses for a second barrier film 520 may be implemented in other embodiments.

An etch stop film 522 may be coupled to the second barrier film 120. Etch stop film 522 may comprise group III-V semiconductor material, group II-VI semiconductor material, or combinations thereof, including, for example, indium phosphide (InP), InAlSb, or suitable combinations thereof. Other material systems including NMOS materials and/or PMOS materials may be used for etch stop film 522 in other embodiments. In an embodiment, etch stop film 522 may comprise a thickness less than about 15 nm. Other thicknesses for etch stop film 522 may be implemented in other embodiments.

A contact film 524 may be coupled to the etch stop film 522. Contact film 524 may comprise an electrode material with low contact resistance. Contact film 524 may comprise group III-V semiconductor material, group II-VI semiconductor material, or combinations thereof, including, for example, InGaAs. Other material systems including NMOS materials and/or PMOS materials may be used for contact film 524 in other embodiments. In an NMOS embodiment, contact film 524 may be doped with n-type impurities. In a PMOS embodiment, contact film 524 may be doped with p-type impurities. In an embodiment, contact film 524 comprises a thickness less than about 50 nm. Other thicknesses of a contact film 524 may be used in other embodiments.

Various films of multi-gate device 500 may be deposited by epitaxial deposition methods in one or more embodiments. Buffer film 304, graded buffer film 306, first barrier film 308, multi-gate fin 410, spacer film 516, doped film 518, second barrier film 520, etch stop film 522, or contact film 524, or combinations thereof, may be deposited, for example, by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

Figure 6:
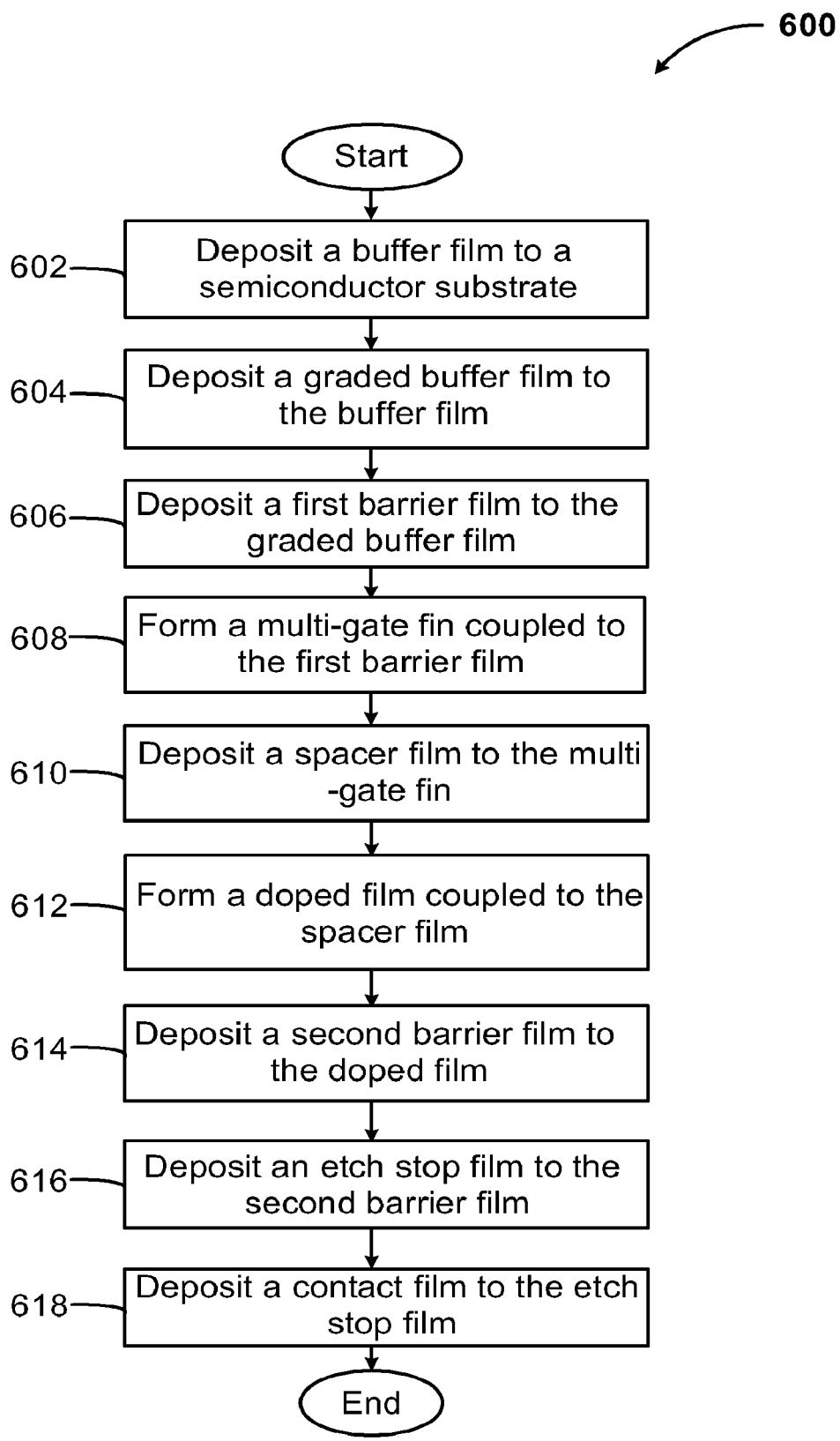
FIG. 6 is a flow diagram of a method for fabricating a multi-gate device, according to but one embodiment.

FIG. 6 is a flow diagram of a method for fabricating a multi-gate device, according to but one embodiment. In an embodiment, method 600 includes depositing a buffer film to a semiconductor substrate at box 602, depositing a graded buffer film to the buffer film at box 602, depositing a first barrier film to the graded buffer film at box 606, forming a multi-gate fin coupled to the first barrier film at box 608, depositing a spacer film to the multi-gate fin at box 610, forming a doped film coupled to the spacer film at box 612, depositing a second barrier film to the doped film at box 614, depositing an etch stop film to the second barrier film at box 616, and depositing a contact film to the etch stop film at box 618.

In an embodiment, method 600 includes depositing one or more buffer films 602, 604 to a surface of a semiconductor substrate, depositing a first barrier film to the one or more buffer films 606, and forming a multi-gate coupled to the first barrier film 608, the multi-gate fin comprising a source region, a drain region, and a channel region of a multi-gate device wherein the channel region is disposed between the source region and the drain region in at least one dimension. Forming the multi-gate fin 608 may include epitaxially depositing a multi-gate fin to material to the first barrier film and patterning the multi-gate fin material to form a multi-gate fin wherein no dopants are introduced to the channel region of the multi-gate fin. In an embodiment, the multi-gate material comprises indium gallium arsenide (InGaAs), indium antimonide (InSb), a group III-V semiconductor material, or a group II-VI semiconductor material, or combinations thereof.

In an embodiment, forming a multi-gate fin 608 includes forming a multi-gate fin comprising a first surface, a second surface, and a third surface. According to an embodiment, the third surface of the multi-gate fin is substantially parallel with the surface of the semiconductor substrate and the first surface of the multi-gate fin is substantially parallel with the second surface and substantially perpendicular with the third surface.

Method 600 may further include depositing a spacer film 610 to the multi-gate fin. Depositing a spacer film 610 may comprise depositing the spacer film to substantially cover the first surface, the second surface, and the third surface of the multi-gate fin in the channel region.

Method 600 may further include forming a doped film coupled to the spacer film 612. Forming a doped film coupled to the spacer film 612 may include epitaxially depositing a film of semiconductor material to the spacer film and introducing a dopant to the film of semiconductor material by modulation doping, or delta-doping, or combinations thereof. In an embodiment, the dopant comprises silicon (Si), tellurium (Te), beryllium (Be), carbon (C), or combinations thereof. The doped film may provide higher carrier mobility in the multi-gate device than a multi-gate device comprising dopant in a channel region of a multi-gate fin. In another embodiment, forming the doped film 612 includes depositing a film of semiconductor material to be doped to substantially cover the spacer film in at least the channel region of a multi-gate to device.

Method 600 may further include depositing a second barrier film to the doped film 614, depositing an etch stop film to the second barrier film 616, and depositing a contact film to the etch stop film 618. In an embodiment, depositing the contact film 618, the etch film 616, the second barrier film 614, the doped film 612, the spacer film 610, the multi-gate fin 608, the first barrier film 606, or the one or more buffer films 602, 604, or combinations thereof, comprises depositing by molecular beam epitaxy (MBE), atomic layer epitaxy (ALE), epitaxial growth, chemical beam epitaxy (CBE), metal-organic chemical vapor deposition (MOCVD), or combinations thereof.

Method 600 may further include other semiconductor fabrication processes such as lithography, etch, thin films deposition, planarization, diffusion, metrology, or other actions associated with semiconductor fabrication. Method 600 may include embodiments already described with respect to analogous structures and techniques in FIGS. 1-5.

Various operations may be described as multiple discrete operations in turn, in a manner that is most helpful in understanding the claimed subject matter. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 7:
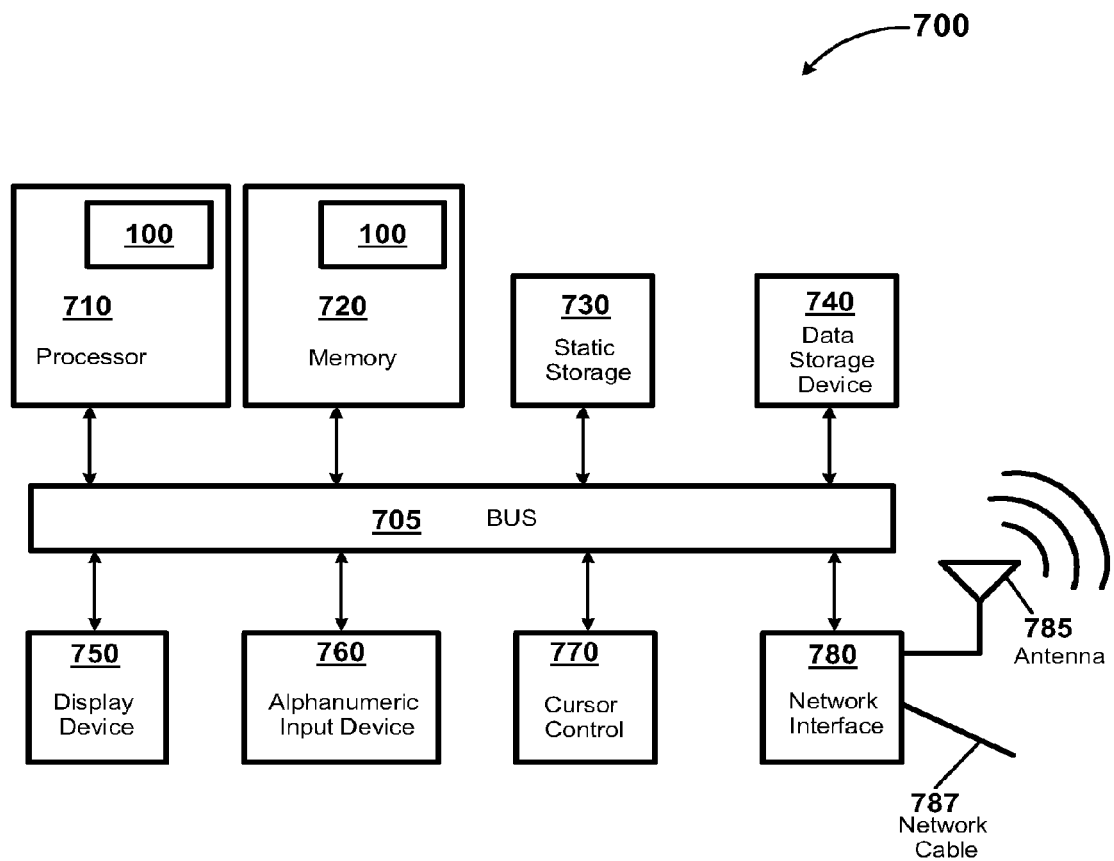
FIG. 7 is a diagram of an example system in which a multi-gate device as described to herein may be used, according to but one embodiment.

FIG. 7 is a diagram of an example system in which a multi-gate device as described herein may be used, according to but one embodiment. System 700 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 700 includes a multi-gate device 100 in accordance with embodiments described with respect to FIGS. 1-5. In an embodiment, a multi-gate device 100 as described herein is part of an electronic system's processor 710 or memory 720. Electronic system 700 may include a process and a memory coupled with the processor, wherein the processor 710 or memory 720, or combinations thereof comprise one or more multi-gate devices 100 as described herein. In an embodiment, the one or more multi-gate devices 100 comprise a p-type metal-oxide-semiconductor (PMOS) device, or an n-type metal-oxide-semiconductor (NMOS) device, or combinations thereof.

Electronic system 700 may include bus 705 or other communication device to communicate information, and processor 710 coupled to bus 705 that may process information. While electronic system 700 may be illustrated with a single processor, system 700 may include multiple processors and/or co-processors. In an embodiment, processor 710 includes a multi-gate device 100 in accordance with embodiments described herein. System 700 may also include random access memory (RAM) or other storage device 720 (may be referred to as memory), coupled to bus 705 and may store information and instructions that may be executed by processor 710.

Memory 720 may also be used to store temporary variables or other intermediate to information during execution of instructions by processor 710. Memory 720 is a flash memory device in one embodiment. In another embodiment, memory 720 includes a multi-gate device 100 as described herein.

System 700 may also include read only memory (ROM) and/or other static storage device 730 coupled to bus 705 that may store static information and instructions for processor 710. Data storage device 740 may be coupled to bus 705 to store information and instructions. Data storage device 740 such as a magnetic disk or optical disc and corresponding drive may be coupled with electronic system 700.

Electronic system 700 may also be coupled via bus 705 to display device 750, such as a cathode ray tube (CRT) or liquid crystal display (LCD), to display information to a user. Alphanumeric input device 760, including alphanumeric and other keys, may be coupled to bus 705 to communicate information and command selections to processor 710. Another type of user input device is cursor control 770, such as a mouse, a trackball, or cursor direction keys to communicate information and command selections to processor 710 and to control cursor movement on display 750.

Electronic system 700 further may include one or more network interfaces 780 to provide access to network, such as a local area network. Network interface 780 may include, for example, a wireless network interface having antenna 785, which may represent one or more antennae. Network interface 780 may also include, for example, a wired network interface to communicate with remote devices via network cable 787, which may be, for example, an Ethernet cable, a coaxial cable, a fiber optic cable, a serial cable, or a parallel cable.

In one embodiment, network interface 780 may provide access to a local area network, to for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported. IEEE 802.11b corresponds to IEEE Std. 802.11b-1999 entitled "Local and Metropolitan Area Networks, Part 11: Wireless LAN Medium Access Control (MAC) and Physical Film (PHY) Specifications: Higher-Speed Physical Film Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Film (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 780 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 700 includes one or more omnidirectional antennae 785, which may refer to an antenna that is at least partially omnidirectional and/or substantially omnidirectional, and a processor 710 coupled to communicate via the antennae.

The above description of illustrated embodiments, including what is described in the to Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. A system comprising:
a processor; and
a memory coupled with the processor, wherein the processor or the memory, or combinations thereof comprise one or more multi-gate devices, the one or more multi-gate devices comprising:
a semiconductor substrate comprising a surface;
one or more buffer films coupled to the surface of the semiconductor substrate;
a first barrier film coupled to the one or more buffer films;
a multi-gate fin coupled to the first barrier film, the multi-gate fin comprising a source region, a drain region, and a channel region of a multi-gate device wherein the channel region is disposed between the source region and the drain region;
a spacer film coupled to the multi-gate fin; and
a doped film coupled to the spacer film a second barrier film coupled to the doped film; an etch stop film coupled to the second barrier film; and a contact film coupled to the etch stop film.

2. A system according to claim 1 wherein the multi-gate fin comprises indium gallium arsenide (InGaAs), indium antimonide (InSb), a group III-V semiconductor material, or a group II-VI semiconductor material, or combinations thereof, and wherein the channel region of the multi-gate fin does not comprise dopant.

3. A system according to claim 1 wherein the one or more multi-gate devices comprise a p-type metal-oxide-semiconductor (PMOS) device or an n-type metal-oxide-semiconductor (NMOS) device and wherein the doped film is modulation doped, or delta-doped, or combinations thereof, the doped film comprising silicon (Si), tellurium (Te), beryllium (Be), carbon (C), or combinations thereof, wherein the doped film comprises higher carrier mobility in the multi-gate device than a multi-gate device comprising dopant in a channel region of a multi-gate fin.

4. A system according to claim 1 wherein the multi-gate fin comprises a first surface, a second surface, and a third surface, wherein the third surface is substantially parallel with the surface of the semiconductor substrate and wherein the first surface is substantially parallel with the second surface and substantially perpendicular with the third surface wherein the spacer film substantially covers the first surface, the second surface, and the third surface of the multi-gate fin in the channel region and wherein the doped film substantially covers the spacer film.

5. A system according to claim 1 wherein the one or more buffer films and the semiconductor substrate are epitaxially coupled, the first barrier film and the one or more buffer films are epitaxially coupled, the multi-gate fin and the first barrier film are epitaxially coupled, the spacer film and the multi-gate fin are epitaxially coupled, or the doped film and the spacer film are epitaxially coupled, or combinations thereof.

6. A system according to claim 1 wherein the semiconductor substrate comprises silicon (Si), the one or more buffer films comprise gallium arsenide (GaAs), indium aluminum arsenide (InAlAs), or combinations thereof, the first barrier film comprises indium aluminum arsenide (InAlAs), the spacer film comprises indium aluminum arsenide (InAlAs), the second barrier film comprises indium aluminum arsenide (InAlAs), the etch stop film comprises indium phosphide (InP), and the contact film comprises indium gallium arsenide (InGaAs).

* * * * *